(12) United States Patent
Ring et al.

(10) Patent No.: US 6,281,025 B1
(45) Date of Patent: Aug. 28, 2001

(54) SUBSTRATE REMOVAL AS A FUNCTION OF SIMS ANALYSIS

(75) Inventors: Rosalinda M. Ring; Rama R. Goruganthu; Brennan V. Davis; Jeffrey D. Birdsley; Michael R. Bruce, all of Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/409,320

(22) Filed: Sep. 30, 1999

(51) Int. Cl.[7] ................................................. H01L 21/00
(52) U.S. Cl. ............................................ 438/10; 250/307
(58) Field of Search ............................... 438/4, 5, 10, 14, 438/15, 108, 690, 977; 257/778; 204/192.32, 192.33, 298.32, 298.36; 250/307, 309, 492.2, 492.3

(56) References Cited

U.S. PATENT DOCUMENTS 5,821,549 * 10/1998 Talbot et al. ......................... 250/307
6,210,981 * 4/2001 Birdsley et al. ........................ 438/9

* cited by examiner

Primary Examiner—Keith Christianson

(57) ABSTRACT

Substrate removal for post-manufacturing analysis of a semiconductor device is enhanced via a method and system that utilizes ion beam etching, to etch the backside of a semiconductor chip, and utilizes SIMS as a detection technique to not only control removal of the substrate from the backside of the chip but also to determine the endpoint of the removal process. In an example embodiment there is described a method for removing substrate from the backside of a semiconductor chip as a function of detected concentration levels of a selected substrate material that is sputtered off of a region of the substrate.

21 Claims, 5 Drawing Sheets

SUBSTRATE REMOVAL AS A FUNCTION OF SIMS ANALYSIS

FIELD OF THE INVENTION

The present invention relates generally to semiconductor chips and their fabrication and, more particularly, to post-manufacturing testing of semiconductor chips involving substrate removal.

BACKGROUND OF THE INVENTION

The semiconductor industry has recently experienced technological advances that have permitted dramatic increases in circuit density and complexity, and equally dramatic decreases in power consumption and package sizes. Present semiconductor technology now permits single-chip microprocessors with many millions of transistors, operating at speeds of hundreds of millions of instructions per second to be packaged in relatively small, air-cooled semiconductor device packages. A by-product of such high density and high functionality in semiconductor devices has been the demand for increased numbers of external electrical connections to be present on the exterior of the die and on the exterior of the semiconductor packages which receive the die, for connecting the packaged device to external systems, such as a printed circuit board.

To increase the number of pad sites available for a die, to reduce the electrical path to the pad sites, and to address other problems, various chip-packaging techniques have been developed. One of these techniques is referred to as controlled collapse chip connection or flip-chip packaging. With packaging technology, bonding pads of the die include metal (solder) bumps. Electrical connection to the package is made when the die is flipped over and soldered to the package. Each bump connects to a corresponding package inner lead. The resulting packages are low profile and have low electrical resistance and a short electrical path. The output terminals of the package, which are sometimes ball-shaped conductive bump contacts, are typically disposed in a rectangular array. These packages are occasionally referred to as Ball Grid Array (BGA) packages. Alternatively, the output terminals of the package may be pins and such packages are commonly known as pin grid array (PGA) packages.

Once the die is attached to such a package the backside portion of the die remains exposed. The transistors and other circuitry are generally formed in a very thin epitaxially grown silicon layer on a single crystal silicon wafer from which the die is singulated. The side of the die including the epitaxial layer containing the transistors and other circuitry is often referred to as the circuit side or front side of the die. The circuit side of the die is positioned very near the package and opposes the backside of the die. Between the backside and the circuit side of the die is single crystalline silicon.

The positioning of the circuit side near the package provides many of the advantages of the flip chip. However, in some instances orienting the die with the circuit side face down on a substrate is disadvantageous. Due to this orientation of the die, the transistors and circuitry near the circuit side are not directly accessible for testing, modification or other purposes. Therefore, access to the transistors and circuitry near the circuit side is from the backside of the chip.

Techniques have been developed to access the circuit even though the integrated circuit (IC) is buried under the bulk silicon. For example, near-infrared (nIR) microscopy is capable of imaging the circuit because silicon is relatively transparent in these wavelengths of the radiation. To acquire these images, because of the absorption losses of IR radiation in silicon, it is generally required to thin the die to less than 100 microns. For example, on a die that is 725 microns thick, at least 625 microns of silicon is typically removed before IR microscopy can be used. Thinning the die for failure analysis of a flip chip bonded IC is usually accomplished by first thinning the die across the whole die surface, often referred to as global thinning. Mechanical polishing, such as chemical-mechanical polishing (CMP), is one method for global thinning. Once an area is identified using IR microscopy as an area of interest and it is determined that access is needed to a particular area of the circuit, local thinning techniques are often used to thin an area smaller than the die size.

During failure analysis, or for design debug, it is sometimes desirable to make electrical contact and probe certain circuit nodes on the circuit side or front side of a die, or to reconfigure the conductors in an integrated circuit. This access is generally done by milling through substrate to access the node, or milling to the node and subsequently depositing a metal to electrically access the node. Often, global and local thinning as described above are used to accomplish such milling. Accurate determination of the thickness of the silicon in the backside, however, is not readily achieved, making the milling process difficult to control. When not controlled properly, substrate removal can result in damage to or destruction of circuitry and other substrate in the device.

Therefore, it is desirable to have the ability to determine the endpoint of the removal process with sufficient accuracy to avoid milling off the node to which access is being sought, which could often jeopardize further device analysis. It would also be desirable to know how far and at what speed the removal process has proceeded in order to more efficiently and more accurately control the removal process. It would also be useful to develop a method of reaching the endpoint of the die without having to implement the additional steps of global and local thinning of the substrate.

SUMMARY OF THE INVENTION

The present invention is directed to a method and system for post-manufacturing analysis of a semiconductor chip device involving the controlled removal of substrate using ion beam energy to mill the substrate and secondary ion detection to automatically stop the milling process when the endpoint is reached or reduce the milling rate when the endpoint is near. The present invention is exemplified in a number of implementations and applications, some of which are summarized below.

According to an example embodiment, the present invention is directed to a method for removing substrate from the backside of a semiconductor chip for post-manufacturing analysis as a function of detected concentration levels of a selected substrate material that is sputtered off of a region of the substrate.

According to another example embodiment of the present invention, there is described a method for removing substrate from a semiconductor chip for post-manufacturing analysis, the chip having a back side opposite circuitry near a circuit side. A portion of substrate in the back side of the semiconductor chip is first removed as a function of the concentration level of a selected substrate material sputtering off of a region of the substrate. An aperture is formed in the substrate as a portion of the substrate is removed.

Removal of a selected substrate material from the backside of the chip is detected as the aperture is being formed. Finally, the substrate removal process is controlled as a function of detected concentration levels of the selected substrate material.

In another example embodiment there is described a system for removing substrate from a semiconductor chip having a backside opposite circuitry near a circuit side. The system includes a mechanism for removing substrate from the back side of the semiconductor chip to form an aperture as well as a mechanism for detecting removal of a selected substrate material from the back side of the chip as the aperture is being formed. The system also includes a mechanism for controlling the substrate removing mechanism as a function of detected concentration levels of the selected substrate material.

The above summary of the present invention is not intended to describe each illustrated embodiment or every implementation of the present invention. The figures and detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
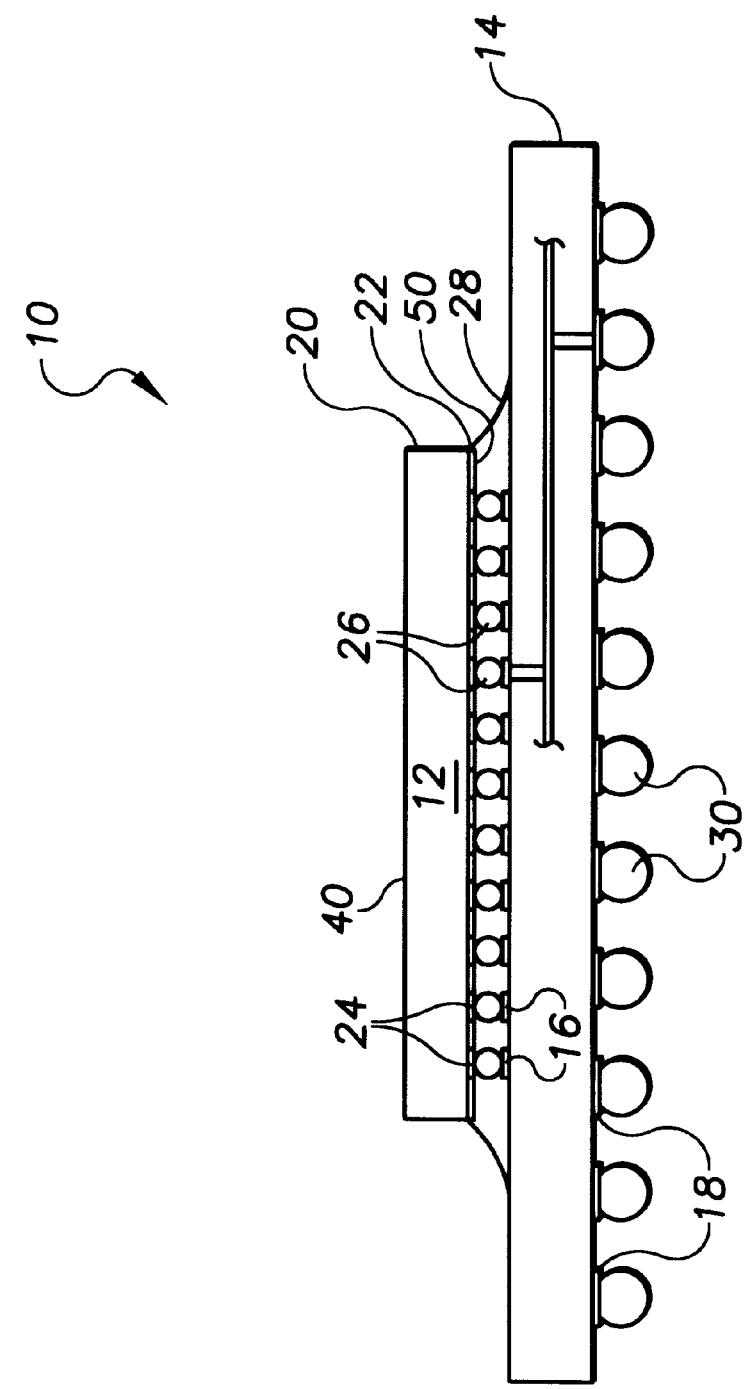
FIG. 1 is a flip-chip type semiconductor device for use in connection with the present invention.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable for a variety of different types of semiconductor devices, and the invention has been found to be particularly suited for flip-chip and other type devices requiring or benefiting from post-manufacturing analysis involving substrate removal. In the present invention ion beam etching technology is used to etch the backside of a semiconductor chip while using the detection capabilities of the SIMS technique to control removal of substrate material when post manufacturing analysis is being conducted on the chip. While the present invention is not necessarily limited to such devices, various aspects of the invention may be appreciated through a discussion of various examples using this context.

The method of the present invention for removing substrate for post-manufacturing analysis of a semiconductor chip is applicable to a variety semiconductor devices. For example, FIG. 1 shows a side view of an assembly 10 of one type of conventional flip chip type die 12 assembled to a package substrate 14. Flip chip die 12 has a circuit side 50 and a backside 40. The circuit side 50 includes a number of circuit devices formed near the circuit side in a portion of the die known as the epitaxial layer 22. The epitaxial layer 22 has a thickness in the range of 1 to 15 microns. The portion of the die shown above the epitaxial layer is known as the bulk layer 20. A plurality of solder bumps 26 are made on the circuit side 50 at pads 24. The solder bumps 26 are the inputs and outputs to the circuitry associated with the die 12.

The flip chip type die 12 is attached to package substrate 14, such as a package for a flip chip via the solder bumps on the die 12. The package substrate 14 includes pads 16 that are arranged to correspond to the pattern of solder bumps on the die 12. The region between integrated circuit 12 and package substrate 14 is filled with an under-fill material 28 to encapsulate the solder bump connections and provide additional mechanical benefits. The pads 16 are coupled via circuitry to pads 18 on the package substrate. Solder bumps 30 are formed on the pads 18. The solder bumps 30 are the inputs and outputs to the circuitry associated with the package substrate 14. In another arrangement (not illustrated), the inputs and outputs to the circuitry associated with the package substrate 14 are implemented as pins rather than solder bumps.

In connection with an example embodiment of the present invention, secondary ions that are sputtered off the substrate by a focused ion beam (FIB) can be mass analyzed to determine their chemical composition and concentration. The concentration of substrate substance varies according to the region of the chip from which the ions are being ejected. This variation in substance concentration can be detected and be used for determining the progression of the substrate removal process, including determining the endpoint of the process. Once the desired level, or endpoint, has been reached a secondary ion mass spectrometry (SIMS) based mechanism automatically signals the FIB to stop milling.

SIMS characterizes dopant concentrations in two dimensions: at the surface of a particular region and also as a function of depth. The SIMS technique uses an ion beam (usually oxygen or cesium) to sputter away layers of the doped region. The sputtered dopant region produces ions that can then be mass analyzed. The sputtered ions are collected by a mass spectrometer for mass to charge separation and detection. The number of ions collected can also be digitally counted to produce quantitative data on the sample composition. SIMS primarily analyzes the material removed by sputtering from a sample surface. By monitoring the secondary ion signals with time, a depth profile can be produced. Sputter rates of 2–5 Å/sec., at data acquisition times of 10 seconds, produce typical depth increments in the 20–50 Å range. Usually the incident beam is rastered over a small area of the surface to create a hole or aperture with a nearly flat bottom. Mass analysis is only performed on the ionic fraction of sputtered material from the center of the hole.

Figure 2A:
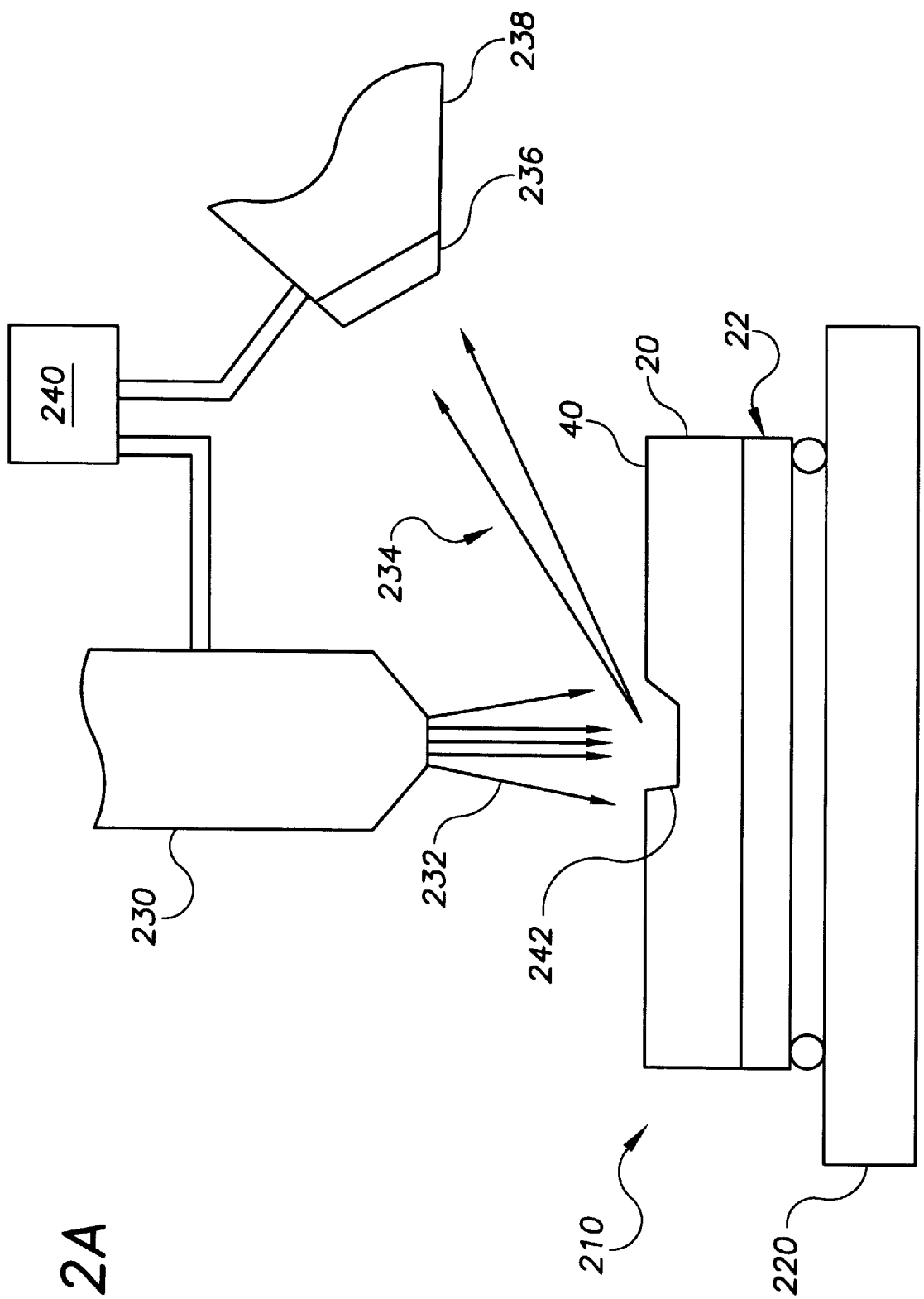
FIGS. 2A and 2B show a semiconductor device undergoing analysis and an enlarged section of the analyzed device, respectively, according to an example embodiment of the present invention.

According to another example embodiment of the present invention, FIG. 2A shows a semiconductor device 210 undergoing post-manufacturing analysis. The semiconductor device 210 may, for example, be a flip chip device such as shown in FIG. 1, or another type of integrated circuit device. Device 210 is placed, with backside 40 facing up, on a platform 220 within an ion excitation chamber. A focused ion beam (FIB) generating device 230 is positioned over device 220 and used to direct an ion beam 232 at the semiconductor device 210. Ion beam 232 starts to mill (anisotropically etch) an aperture or hole 242 in bulk layer 20 as secondary ions 234 are sputtered off of the substrate. Secondary ions 234 are channeled by a mass spectrometer 236 to a secondary ion detector 238. The data collected from detector 238 is process by a computer arrangement 240 that is coupled to both detector 238 and to FIB 230 via a controller that is capable of terminating the ion beam 232 at a designated time or depth. Once the desired depth in the silicon substrate is achieved, computer arrangement 240 sends a control signal to FIB 230 via the controller to either reduce the rate of substrate removal (as you are nearing the endpoint the energy level of the ion beam is varied) or terminate the etching altogether (endpoint reached, shut down the ion beam).

In this example embodiment, Gallium (Ga+) ions are used to bombard bulk layer 20 and eventually mill aperture 242 into bulk layer 20. Gallium is used since its weight in atomic mass units is high, thereby serving as a good bombardment agent. Other elements can be used as bombardment agents depending on the energy level used and the substrate material to be detected by the ion detector and computer arrangement. The energy level of the ion beam is kept to about 1–50 keV in order to cause collisions with the atoms at the surface leading to their ejection. The size of the aperture of the FIB 230 or the ion beam current density, could also be changed to adjust the energy of the ion beam, which in turn changes the milling rate (i.e., substrate removal rate) of FIB 230 on bulk layer 20.

Figure 2B:
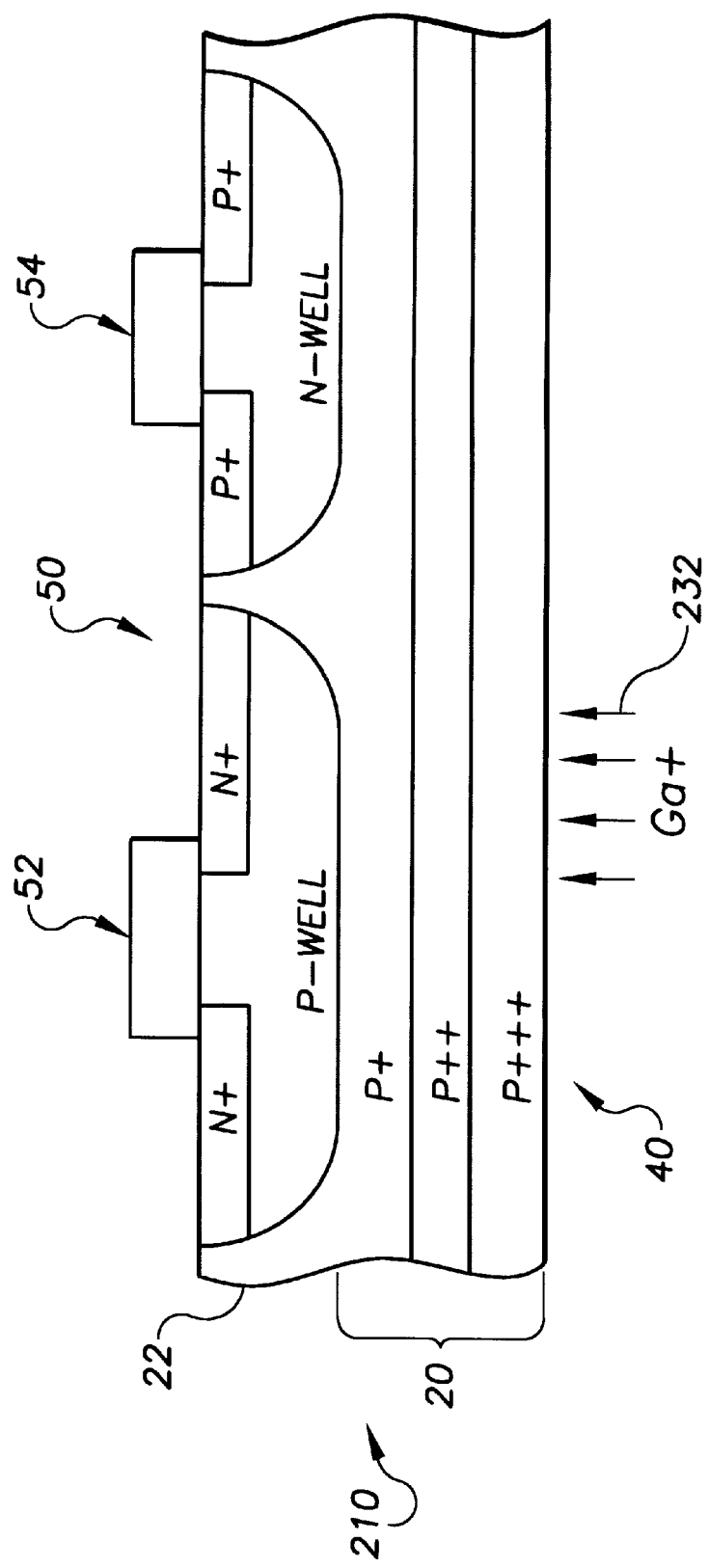

FIG. 2B illustrates an enlarged portion of device 210 having the backside of the die at the bottom (backside 40) and circuit side 50 on top. In this example embodiment, bulk layer 20 is formed of three p-type layers (P+++, P++ and P+) with transistors 52 and 54 disposed at the top, with each having p- and n- wells, respectively, and oppositely doped source and drain regions. Arrows 232 indicate the Gallium ions that are being emitted from FIB 230 through backside 40 of device 210. The present invention utilizes the dopant diffusion profile or concentration gradient for silicon thickness as a depth monitor. Each of the interfaces shown can serve as an endpoint or a depth indicator: P+++/P++ interface; P++/P+ interface; and P+/P– well interface or is P+/N– well interface. Conductive lines during microsurgery can also serve as an endpoint.

Figure 3:
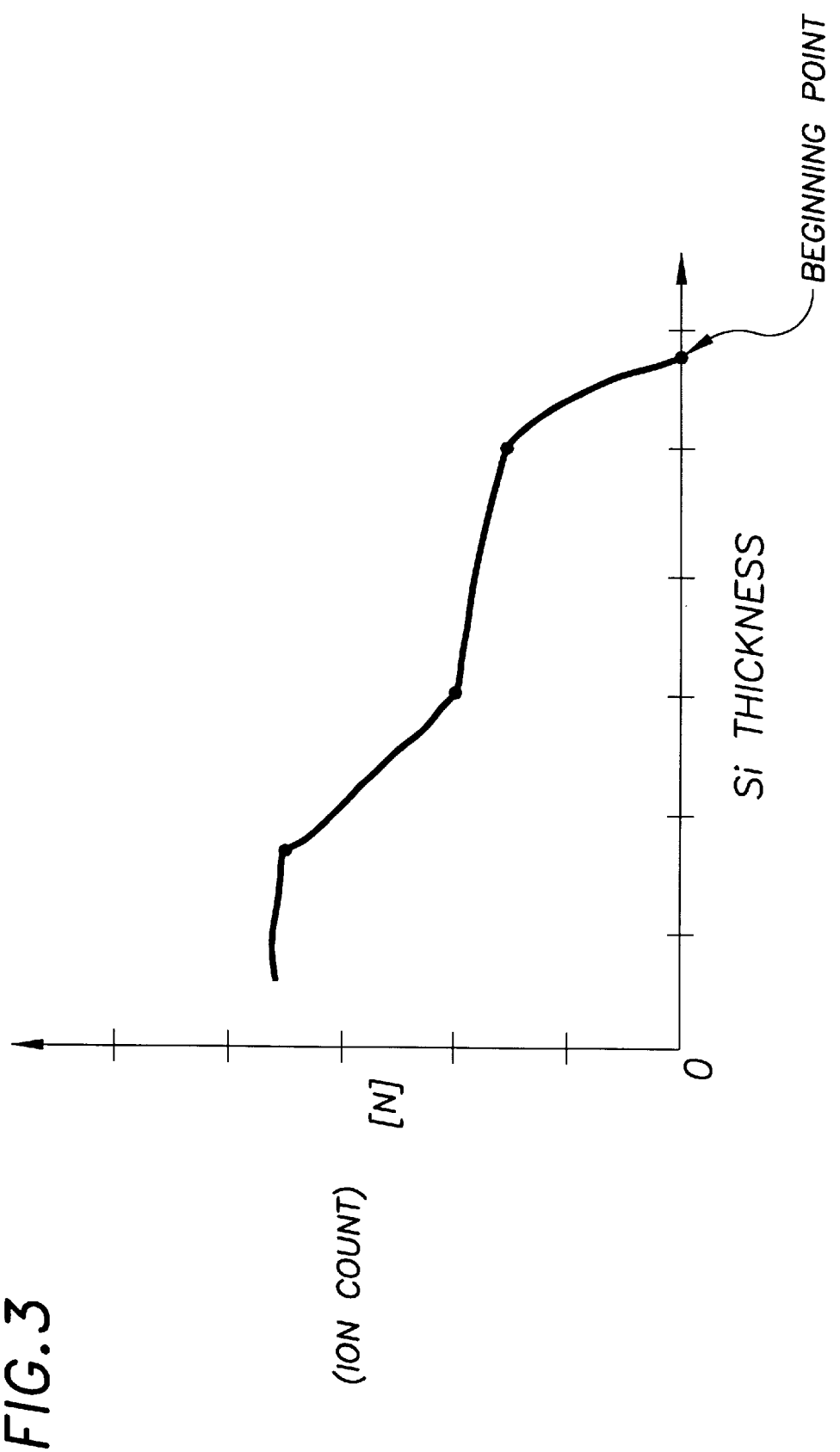
FIG. 3 is example graph showing SIMS depth profile exhibiting ion concentrations versus silicon thickness, according to an example embodiment of the present invention.

Referring to FIG. 3, in order to determine the remaining silicon thickness of the device an ion count or concentration ([N]) versus silicon (Si) thickness calibration curve or look up table can be developed. Each process technology would have their respective set of curves. The FIB/SIM system, using the look-up table derived from a curve shown in FIG. 3, could be programmed to stop the process at a certain time. Note that as milling (etching) progresses further into the substrate, [N] (ion count) detected increases (as shown by the curve). Milling could be stopped at a certain point (ion concentration level) on the [N]/Si thickness curve or when a certain element is detected, such as Phosphorus or Boron. The system also has the capability of detecting carrier concentration gradient or range of $10^{15}$ to $10^{20}$ carriers/cm$^3$.

Referring to FIGS. 2B and 3, particularly the epitaxial interfaces of device 210, as bulk silicon is removed from backside 40, different dopant concentrations are detected as milling progresses through the various interfaces. Computer arrangement 240 can be programmed to stop milling (etching), or reduce the milling rate, at any point desired as each interface is detected (e.g. P+++/P++). As milling progresses the actual detected concentration data is fed back, in the form of ion intensity (which correlates to concentration), to computer 240 for comparison with a reference curve to determine the current status of the milling process. The concentration of the detected element could be low at the highest value of silicon thickness (FIG.3, Beginning Point) since substrate removal is started on the backside of the device and thickness drops as it nears the selected substrate material or desired concentration level. The original circuit designs can serve as the reference profiles that computer 240 can use when comparing actual detection data, received from a milling operation, to the reference profile.

Figure 4:
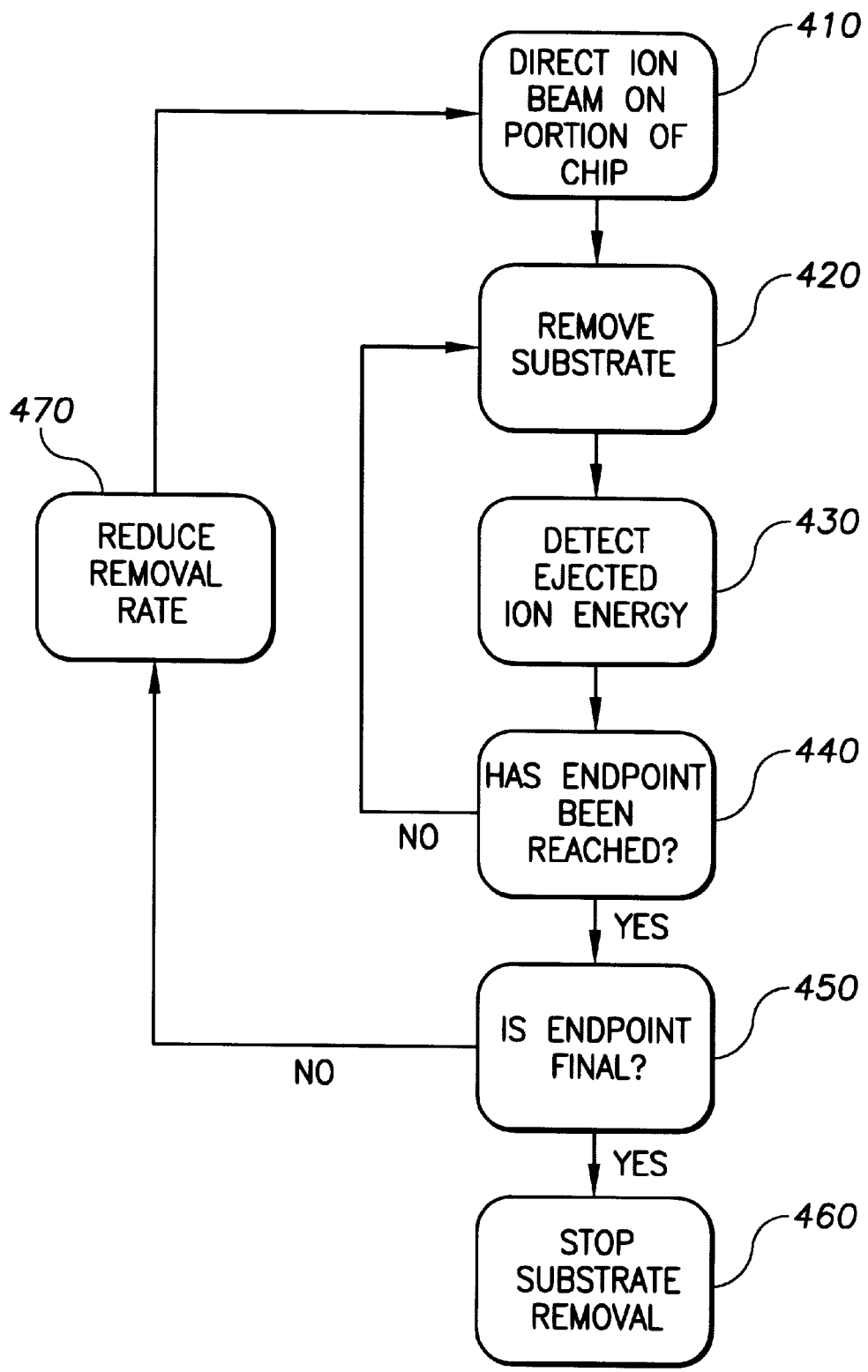
FIG. 4 is a flow chart for a method for post-manufacturing analysis of a semiconductor chip, according to another example embodiment of the present invention.

FIG. 4 is a flow chart for a method of removing substrate from a semiconductor device, according to another example embodiment of the present invention. The chip is placed in a chamber and an ion beam is directed at the chip at block 410. A portion of substrate is removed (block 420) from a semiconductor chip and an aperture formed as the ion beam bombards the substrate surface and begins to eject (sputter) ions. The substrate removal can be accomplished using a device such as a focused ion beam (FIB) or other ion bombardment device that can be detected and identified by the SIMS technique. At block 430, ions sputtered off of the substrate (thereby forming the aperture) are detected and used to determine the type of substrate material that is currently being etched (sputtered off) by the ion beam. Comparing this information to the reference profile can then give an indication of the depth achieved so far by the etch process of the aperture within the substrate.

At block 440, it is determined if an endpoint has been reached. An endpoint may, for instance, be associated with a particular depth of substrate removal. If no endpoint has been reached, the chip continues to be etched by the ion beam (ion bombardment) and the method continues at block 420. If an endpoint has been reached at block 440, it is determined if the endpoint is final. A final endpoint is associated with the end of the substrate removal process as the ion beam has started to eject ions associated with a particular element (e.g. P or B). A non-final endpoint may be associated with nearing the final endpoint (as ion intensity is increasing, indicating increased concentrations of the selected substrate material); this is a point in the substrate removal process at which time it may be desirable to slow the substrate removal rate so as not to exceed the final endpoint and thereby damage the chip. If the endpoint is not final at block 450, the substrate removal rate is reduced at block 470 and the method continues at block 410. If the endpoint at block 450 is final, the substrate removal is stopped at block 460.

The rate at which substrate is removed can be determined as a function of the semiconductor device's dopant diffusion profile (or concentration gradient) and the removal/detection process, and can be controlled to proceed at a speed that will remain non-destructive to other active elements in the device. For example, the determination of whether an endpoint has been reached in block 440, or whether it is final at block 450, could be performed by computer arrangement 240, shown in FIG. 2A. Once the depth of substrate removal is determined the substrate removal rate can be controlled or the process terminated if the endpoint is reached.

SIMS is particularly useful in that it is one of the few semiconductor characterization techniques that are capable of detecting all the elements and it can identify the elements present in very low concentration levels. It is one of the few surface analysis techniques that can measure doping level concentrations in electronic materials, therein being particularly useful in detecting the different doping levels as interfaces in the substrate are crossed. SIMS is an excellent tool for generating concentration profiles of dopants in silicon at levels down to the $1 \times 10^{15}$ cm$^3$ range.

While the present invention has been described with reference to several particular example embodiments, those skilled in the art will recognize that many changes may be made thereto without departing from the spirit and scope of the present invention, which is set forth in the following claims.

What is claimed is:

1. A method for removing substrate from a semiconductor chip for post-manufacturing analysis, wherein the chip has a back side opposite circuitry near a circuit side, the method comprising removing a portion of substrate in the back side of the semiconductor chip as a function of detected concentration levels of a selected substrate material that is sputtered off of a region of the substrate.

2. The method for removing substrate from a semiconductor chip according to claim 1, wherein removing a portion of substrate in the back side of the semiconductor chip as a function of the concentration level of a selected substrate material sputtering off of a region of the substrate comprises:

removing a portion of substrate in the backside of the semiconductor chip so as to form an aperture therein;

detecting removal of a selected substrate material from the back side of the chip as the aperture is being formed; and controlling the substrate removal as a function of detected concentration levels of the selected substrate material.

3. The method of claim 2, wherein removing a portion of the substrate includes directing an ion beam at a portion of the substrate that generates ions that are sputtered off of the substrate.

4. The method of claim 2, wherein detecting removal of a substrate material includes detecting ions, via an ion detector, sputtering off of the backside of the chip.

5. The method of claim 3, wherein the ion beam is comprised of gallium ions.

6. The method of claim 2, wherein controlling substrate removal is responsive to detecting at least one of a predetermined element material and a dopant concentration level.

7. The method of claim 2, wherein controlling the substrate removal as a function of detected concentration levels of the selected substrate material comprises:

detecting an actual concentration level of the selected substrate material sputtered from the backside of the substrate; and comparing the actual concentration level to a reference concentration level in order to determine the amount of substrate that has been removed.

8. The method of claim 2, further including providing a computer arrangement programmed to use the detected concentration levels of the selected substrate material to control the rate of substrate removal.

9. The method according to claim 2, wherein controlling the substrate removal as a function of detected concentration levels of the selected substrate material comprises stopping substrate removal upon detection of a selected substrate material sputtered from the backside of the substrate.

10. The method according to claim 2, wherein controlling the substrate removal as a function of detected concentration levels of the selected substrate material comprises reducing the rate of substrate removal upon detection of a selected substrate material sputtered from the backside of the substrate.

11. A method for removing substrate from a semiconductor chip having a back side opposite circuitry near a circuit side, the method comprising the steps of:

(A) directing an ion beam at a portion of the substrate that generates ions that are sputtered off of the substrate, thereby removing substrate from the back side of the semiconductor chip to form an aperture;

(B) detecting removal of a selected substrate material from the back side of the chip as the aperture is being formed;

(C) repeating steps A and B until the detected substrate thickness reaches an endpoint;

(D) adjusting the substrate removal rate in response to reaching the endpoint;

(E) repeating steps A through D until a final endpoint is detected; and (F) terminating the removal process in response to detecting the final endpoint.

12. The method according to claim 11, wherein directing an ion beam and removing substrate material has a time duration that is a function of the ion beam energy.

13. The method according to claim 11, wherein adjusting substrate removal rate is a function of detected concentration levels of the selected substrate material and comprises:

detecting an actual concentration level of the selected substrate material sputtered from the backside of the substrate; and comparing the actual concentration level to a reference concentration level in order to determine the amount of substrate that has been removed.

14. A system for removing substrate from a semiconductor chip having a back side opposite circuitry near a circuit side, the system comprising:

means for removing substrate from the backside of the semiconductor chip to form an aperture;

means for detecting removal of a selected substrate material from the back side of the chip as the aperture is being formed; and means for controlling the means for removing substrate as a function of detected concentration levels of the selected substrate material.

15. The system of claim 14, wherein means for removing substrate includes an ion beam generating device, that is directed at a portion of the substrate, that generates ions that are sputtered off of the substrate, and includes a controller coupled to the ion beam generating device.

16. The system of claim 15, wherein means for controlling the means for removing substrate from the backside of the chip includes a computer arrangement that is coupled to the controller and is adapted to provide a control signal to the controller for controlling the rate of substrate removal.

17. The system of claim 15, wherein the ion beam generating device has a substrate removal time duration that is a function of the ion beam energy.

18. The system of claim 14, wherein means for controlling substrate removal further includes means for detecting an actual concentration level of the selected substrate material sputtered from the backside of the substrate; and means for comparing the actual concentration level to a reference concentration level in order to determine the amount of substrate that has been removed.

19. An apparatus for removing substrate from a semiconductor chip having a back side opposite circuitry near a circuit side, the system comprising:

removal means that removes a portion of substrate in the backside of the semiconductor chip so as to form an aperture therein;

detection means that detects removal of a selected substrate material from the back side of the chip as the aperture is being formed; and controller means that controls the substrate removal as a function of detected concentration levels of the selected substrate material, controller means coupled to detection means and to removal means.

20. The apparatus according to claim 19, wherein controller means further includes a controller coupled to removal means and a computer arrangement coupled to detection means and the controller, the computer arrangement adapted to provide a control signal to the controller for controlling the substrate removal.

21. A method for removing substrate from a semiconductor chip having a back side opposite circuitry near a circuit side, the method comprising:

removing substrate from the backside of the semiconductor chip to form an aperture;

detecting removal of a selected substrate material from the backside of the chip as the aperture is being formed; and controlling the removal of substrate as a function of detected concentration levels of the selected substrate material.

* * * * *

UNITED STATES PATENT AND TRADEMARK OFFICE
CERTIFICATE OF CORRECTION

PATENT NO. : 6,281,025 B1
DATED : August 28, 2001
INVENTOR(S) : Ring et al.

It is certified that error appears in the above-identified patent and that said Letters Patent is hereby corrected as shown below:

<u>Column 3,</u>
Line 35, "FIG. 3 is example graph" should read -- FIG. 3 is an example graph --.

<u>Column 4,</u>
Line 1, "applicable to a variety semiconductor" should read -- applicable to a variety of semiconductor --.

<u>Column 5,</u>
Line 6, "is process by" should read -- is processed by --.

Signed and Sealed this

Twenty-eighth Day of January, 2003

JAMES E. ROGAN
*Director of the United States Patent and Trademark Office*